(12) United States Patent
Drolet et al.

(10) Patent No.: US 8,134,143 B2
(45) Date of Patent: *Mar. 13, 2012

(54) 2,7-CARBAZOLENEVINYLENE DERIVATIVES AS NOVEL MATERIALS IN PRODUCING ORGANIC BASED ELECTRONIC DEVICES

(75) Inventors: Nicolas Drolet, Quebec (CA); Jean-Francois Morin, Quebec (CA); Ye Tao, Ontario (CA); Mario Leclerc, Quebec (CA); Kathleen Sirois, Quebec (CA)

(73) Assignee: National Research Council of Canada, Ottawa, ON (CA)

( * ) Notice: Subject to any disclaimer, the term of this patent is extended or adjusted under 35 U.S.C. 154(b) by 778 days.

This patent is subject to a terminal disclaimer.

(21) Appl. No.: 10/573,883

(22) PCT Filed: Sep. 29, 2004

(86) PCT No.: PCT/CA2004/001755
§ 371 (c)(1),
(2), (4) Date: Feb. 15, 2007

(87) PCT Pub. No.: WO2005/031891
PCT Pub. Date: Apr. 7, 2005

(65) Prior Publication Data
US 2007/0176163 A1   Aug. 2, 2007

Related U.S. Application Data

(60) Provisional application No. 60/507,506, filed on Oct. 2, 2003.

(51) Int. Cl.
*H01L 51/30* (2006.01)
*H01L 51/46* (2006.01)
*C08G 73/06* (2006.01)

(52) U.S. Cl. ............ 257/40; 257/E51.027; 252/301.35; 428/690; 528/423

(58) Field of Classification Search .................. 257/40, 257/E51.028–E51.031, 103; 428/690, 917; 528/422–423; 438/99; 313/504; 252/301.35
See application file for complete search history.

(56) References Cited

U.S. PATENT DOCUMENTS

| | | | | |
|---|---|---|---|---|
| 4,164,431 A | * | 8/1979 | Tang | 136/263 |
| 5,389,444 A | * | 2/1995 | Hosokawa et al. | 428/457 |
| 5,807,974 A | * | 9/1998 | Kim et al. | 528/366 |
| 2003/0008172 A1 | * | 1/2003 | Leclerc et al. | 428/690 |
| 2003/0085397 A1 | * | 5/2003 | Geens et al. | 257/40 |
| 2004/0150328 A1 | * | 8/2004 | Czerw et al. | 313/506 |
| 2007/0069197 A1 | * | 3/2007 | Leclerc | 257/40 |

FOREIGN PATENT DOCUMENTS

| | | |
|---|---|---|
| JP | 11-251601 | 9/1999 |
| JP | 2002093582 A | 3/2002 |
| JP | 2002151708 A | 5/2002 |
| WO | 0184644 A1 | 11/2001 |
| WO | 03070822 A2 | 8/2003 |
| WO | 2004/070772 A2 | 8/2004 |
| WO | 2005/016882 A1 | 2/2005 |

OTHER PUBLICATIONS

Dutta, A.K et al. "Spectroscopic, AFM, and NSOM Studies fo 3D Crystallites in Mixed Langmuir-Blodgett Films of N,N'-Bis(2,6-dimethylphenyl)-3,4,9,10-perylenetetracarboxylic Diimide and Stearic Acid." Langmuir, vol. 15 (1999): pp. 607-612.*
Zotti, G., et al. "Electrochemical, Conductive, and Magnetic Properties of 2,7-Carbazole-Based Conjugated Polymers." Macromolecules, vol. 35 (2002): pp. 2122-2128.*
Dutta, A.K., et al. "Spectroscopic, AFM, and NSOM Studies fo 3D Crystallites in Mixed Langmuir-Blodgett Films of N,N'-Bis(2,6-dimethylphenyl)-3,4,9,10-perylenetetracarboxylic Diimide and Stearic Acid." Langmuir, vol. 15 (1999): pp. 607-612.*
Jin, S.-H., et al. "Synthesis and Characterization of Color Tunable Electroluminescent Polymer by Blending Oxadiazole Containing Polymer." Eur. Poly. J., vol. 37 (2001): pp. 921-925.*
Ahn, T., et al. "Highly Photoluminescent and BLue-Green Electroluminescent Polymers: New Silyl- and Alkoxy-Substituted Poly(p-phenylenevinylene) Related Copolymers Containing Carbazole or Fluorene Groups." Macromolecues, vol. 33 (2000): pp. 6764-6771.*

Lee, J.-H., et al. "Synthesis and Electroluminescent Property of a New Conjugated Polymer Based on Carbazole Derivative: Poly(3,6-N-2-ethylhexyl carbazoyl Cyanoterephthalidene)." Synth. Met., vol. 88 (1997): pp. 31-35.*

Kim, J. J et al. "Synthesis and properties of Photoluminescent Polymers Bearing Electron-Facilitating Oxadiazole Derivative Side Groups." J. Poly. Sci.: Part A: Poly. Chem., vol. 40 (2002): pp. 1173-1183.*

"Synthesis and Electroluminescent Properties of Heterocycle-Containing Poly (p-phenylene vinylene) Derivatives", XP-002281498, Wang et al., 1999 Elsevier Science, vol. 99, Jan. 1, 1999, ISSN: 0379-6779, pp. 249-252.

"Syntheses and Characterization of Electroactive and Photoactive 2,7-Carbazolenevinylene-Based Conjugated Oligomers and Polymers", XP-009116528, Morin et al., vol. 16, No. 23, Jun. 11, 2004, ISSN: 0897-4756, p. 4619-4626.

\* cited by examiner

*Primary Examiner* — Matthew W Such

(74) *Attorney, Agent, or Firm* — Marks & Clerk; S. Mark Budd

(57) ABSTRACT

Organic Field Effect Transistor (OFET), an Organic Light Emitting Diode (OLED), an and an Organic Photovoltaic Cell (OPC) including as active material a conjugated oligomeric or polymeric 2,7-carbazolenevinylene derivative described by the formula (I) or (II):

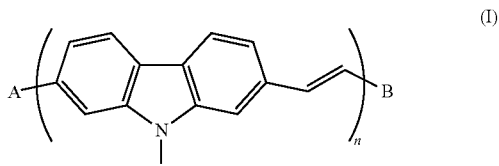

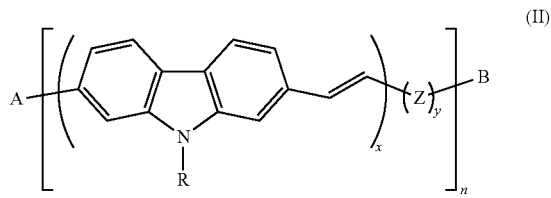

Such OFETs, OLEDs and OPCs have improved devices properties and efficiencies.

18 Claims, 12 Drawing Sheets

| $T_{dep}$ °C | plain | | hmds | | ots | | ods | |
|---|---|---|---|---|---|---|---|---|
| | $\mu$ cm²/V.s | $I_{on}/I_{off}$ | $\mu$ cm²/V.s | $I_{on}/I_{off}$ | $\mu$ cm²/V.s | $I_{on}/I_{off}$ | $\mu$ cm²/V.s | $I_{on}/I_{off}$ |
| 25 | $1.2 \times 10^{-3}$ | $10^5$ | $2.7 \times 10^{-2}$ | $10^6$ | $7.2 \times 10^{-2}$ | $10^6$ | $1.8 \times 10^{-2}$ | $10^6$ |
| 75 | $4.6 \times 10^{-2}$ | $10^6$ | $2.5 \times 10^{-1}$ | $10^6$ | $4.4 \times 10^{-2}$ | $10^6$ | $1.1 \times 10^{-2}$ | $10^6$ |
| 125 | $1.3 \times 10^{-2}$ | $10^6$ | $9.1 \times 10^{-2}$ | $10^6$ | $4.6 \times 10^{-2}$ | $10^6$ | $9.7 \times 10^{-2}$ | $10^6$ |

2,7-CARBAZOLENEVINYLENE DERIVATIVES AS NOVEL MATERIALS IN PRODUCING ORGANIC BASED ELECTRONIC DEVICES

This application claims the benefit of U.S. Provisional Application 60/507,506 filed Oct. 2, 2003.

FIELD OF THE INVENTION

The present invention relates to the field of electronic and optoelectronic devices, and more particularly to organic based semi-conductor devices such as Organic Field Effect Transistors (OFETs), Organic Light Emitting Diodes (OLEDs) and Organic Photovoltaic Cells (OPCs).

BACKGROUND

Organic conjugated oligomers and polymers are materials that possess a delocalized pi-electron system along their backbone. These organic materials are subject to important investigations from both academic and industrial laboratories due to their great potential for applications in electronic and opto-electronic devices, such as field effect transistors (OFETs), light emitting diodes (OLEDs) and photovoltaic cells (OPCs). The economical advantages of using organic over inorganic semi-conducting materials in devices include, low cost of synthesis, ease of processing and the extensive tunability range of their optical and electrical properties through chemical modifications.

The vast majority of microelectronic devices are currently based on inorganic semi-conductor materials such as crystalline silicon. For large area devices including flat-panel displays and smart cards, where the use of crystalline silicon is limited by the size of the single crystals, amorphous and polycrystalline silicon are currently used. However, the relatively high temperatures needed, in their fabrication process prevent their utilization with plastic substrates. On the other hand organic materials can be processed at or near room temperature by solution-processing or thermal evaporation on polymeric substrates. Organic-based devices such as OFETs are gaining interest as their performance has increased up to a point that they now compete with their inorganic counterparts. In the short term, it is recognized that organic semi-conductor materials could be used in the production of low-resolution components, such as identification tags, smart cards and pixel drivers for displays. Up to now, only pentacene and regioregular polythiophenes have demonstrated the required performances, but the former is difficult to process and the later is easily oxidized in air.

Additionally, it has long been felt that a technically viable emissive display technology could compete with the currently dominating technology of liquid crystal displays (LCDs) and OLEDs are today considered to be in the best position to do just that. Current LCDs present limitations such as low efficiency, poor vision angle, and speed and temperature range limitations. OLEDs, however, demonstrate particular promise for displays as they can be tuned to any colour, operate at relatively low voltages with high efficiency and have excellent visual properties. A lot of work is going on in chemistry laboratories to find materials with high luminous quantum efficiency, good colour purity and great stability for the application to OLED displays. While some materials meet or exceed some of the requirements for commercial displays, to date none meets them all.

Furthermore, the need to develop renewable energy sources continues to stimulate new approaches to the conversion of solar energy into electrical energy through the production of photovoltaic devices. Although inorganic semiconductors such as silicon, amorphous silicon, gallium arsenide and sulfide salts, have been the primary focus of commercial applications, the photosensitivity and the photovoltaic effects in devices made with conjugated oligomeric or polymeric organic materials have also been explored and have shown excellent results. The main advantage of using organic materials in photovoltaic devices is the low-cost of fabrication in large sizes and in desired configurations. As an example, the use of semi-transparent organic thin film on the roof area or between insulating windows could be employed as power generation in new and existing buildings.

Intense research is going on at the chemistry level to find a class of organic materials that could be used in OFETs as well as in OLEDs and OPCs. This new class of organic materials should be easy to synthesis at a low cost and should be easy to tune over a wide range of electrical and optical properties through chemical modifications to meet the entire required criteria for commercialization of OFETs, OLEDs and OPCs.

SUMMARY OF THE INVENTION

According to the present invention there are provided organic-based electronic devices and methods of preparing such devices. These devices include Organic Field Effect Transistors (OFETs), Organic Light Emitting Diodes (OLEDs), and Organic Photovoltaic Cells (OPCs) and have as their active material a conjugated 2,7-carbazolenevinylene derivative of the formula (I):

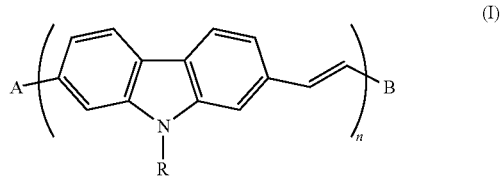

wherein n is an integer$\geq 3$, R represents a substituent that is a hydrogen, or linear or branched alkyl group containing 1 to 20 carbon atoms, linear or branched alkoxy group containing 1 to 20 carbon atoms, poly (ethyleneoxy), cyano, aryl group, amide group or benzoyl group, and A, B are any type of end-cap groups.

For example, A and B end-cap groups can be selected from hydrogen, linear or branched alkyl group containing 1 to 20 carbon atoms, linear or branched alkoxy group containing 1 to 20 carbon atoms, cyano, fluoro, chloro, bromo, iodo, monovalent aromatic group, e.g. a phenyl, a naphthyl, and a anthryl group, or monovalent aromatic complex ring group having one nitrogen atom as a hetero-atom, e.g. a pyrropyl group, a pyridyl group, quinolyl group and a carbazolyl group. These aryl groups (aromatic groups) and aromatic complex ring groups may have, or need not have substituents. For example, substituents may be selected from a linear or branched alkyl group containing 1 to 20 carbon atoms, linear or branched alkoxy group containing 1 to 20 carbon atoms, acyl group, benzyl group, aryloxy group, alkoxy-carbonyl group, acyloxy group, acylamino group, halogen group, carboxyl group, hydroxy group, aminocarbonyl group, aryloxycarbonyl group, aryl group, and further amino group represented by the general formula:

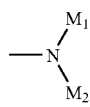

wherein $M_1$ and $M_2$ are each an hydrogen atom, or linear or branched alkyl group, acyl group such as an aldehyde group, a formyl group, an acetyl group and a propyonyl group, aryl group and the like; $M_1$ and $M_2$ may be the same or different, and they may combine with each other to form a saturated five-membered ring or a saturated six-membered ring (these rings may be with or without a substituent), and may combine with the substituents on A and B to form a saturated five-membered ring or a saturated six-membered ring (these rings may be with or without a substituent).

In general formula (I), A and B may be the same or different, and the substituents on A and B may combine with each other to form a saturated five-membered ring or a saturated six-membered ring (these rings may be with or without a substituent).

2,7-carbazolenevinylene monomers can also be alternated with other monomers to form oligomeric or polymeric materials according to the general formula (II):

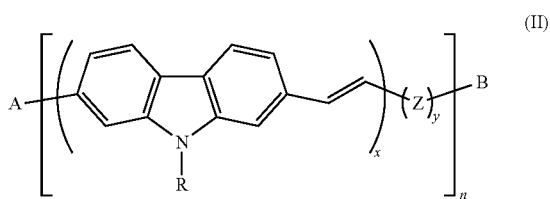

(II)

wherein n is an integer≧3, R represents a substituent that is a hydrogen, or linear or branched alkyl group containing 1 to 20 carbon atoms, linear or branched alkoxy group containing 1 to 20 carbon atoms, poly (ethyleneoxy), cyano, aryl group, amide group or benzoyl group, x is an integer between 1 to 1000, y is an integer between 0 to 1000, Z is any type of comonomer, and A, B are any type of end-cap groups.

The conjugated oligomeric and polymeric 2,7-carbazolenevinylene derivatives comprise repeating or alternating units of the above formula (II). For example, the comonomers can be selected from ethylene, acetylene, $C_6$-$C_{22}$ mononuclear/polynuclear aromatic, $C_2$-$C_{10}$ mononuclear/polynuclear heterocyclic groups and tertiary arylamines.

Examples of mononuclear/polynuclear aromatic group are: phenylene, fluorene, naphthalene, anthracene, tetracene, pyrene, perylene, rubrene, phenanthrene, naphthylene, acenaphthene, fluoranthene and chrysene. Examples of mononuclear/polynuclear heterocyclic internal groups include 5-member heterocyclic groups such as furan, thiophene, pyrrole, oxazole, isooxazole, oxadiazoles, thiazole, isothiazole, imidazole, thiadiazole and pyrazole; 6-member heterocyclic groups such as pyridine, pyridazine, pyrimidine, pyrazine, triazine and tetrazine; benzo-fused ring systems such as benzooxazole, benzothiazole, benzimidazole, quinoline, isoquinoline, cinnoline, quinazoline, quinoxaline, phthalazine, benzothiadiazole and benzotriazine; polynuclear fused condensed ring systems such as phenazine, phenanthridine, acridine and diphenylene oxide. Examples of tertiary arylamine groups include triphenylamine, N,N'-diphenylbenzidine, N,N'-diphenyl-1,4-phenylenediamine and diphenylnaphthylamine. Olefinic, aromatic, heterocyde and tertiary arylamines groups may be substituted optionally with one or more substituents. Examples of substituents include $C_1$-$C_{20}$ linear or branched alkyl group, $C_1$-$C_2$ linear or branched alkoxy group, cyano, fluoro, chloro, bromo, iodo, $C_1$-$C_{20}$ linear or branched alkyloxycarbonyl, $C_1$-$C_{20}$ linear or branched aryloxycarbonyl and poly (alkyleneoxy). Such substituents may be selected to improve the solubility or processing characteristics of the materials.

For example, A and B end-cap groups can be selected from hydrogen, linear or branched alkyl group containing 1 to 20 carbon atoms, linear or branched alkoxy group containing 1 to 20 carbon atoms, cyano, fluoro, chloro, bromo, iodo, monovalent aromatic group, e.g. a phenyl, a naphthyl, and a anthryl group, or monovalent aromatic complex ring group having one nitrogen atom as a hetero-atom, e.g. a pyrropyl group, a pyridyl group, quinolyl group and a carbazolyl group. These aryl groups (aromatic groups) and aromatic complex ring groups may have, or need not have substituents. For example, substituents may be selected from a linear or branched alkyl group containing 1 to 20 carbon atoms, linear or branched alkoxy group containing 1 to 20 carbon atoms, acyl group, benzyl group, aryloxy group, alkoxy-carbonyl group, acyloxy group, acylamino group, halogen group, carboxyl group, hydroxy group, aminocarbonyl group, aryloxycarbonyl group, aryl group, and further amino group represented by the general formula:

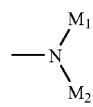

wherein $M_1$ and $M_2$ are each an hydrogen atom, or linear or branched alkyl group, acyl group such as an aldehyde group, a formyl group, an acetyl group and a propyonyl group, aryl group and the like; $M_1$ and $M_2$ may be the same or different, and they may combine with each other to form a saturated five-membered ring or a saturated six-membered ring (these rings may be with or without a substituent), and may combine with the substituents on A and B to form a saturated five-membered ring or a saturated six-membered ring (these rings may be with or without a substituent).

In general formula (II), A and B may be the same or different, and the substituents on A and B may combine with each other to form a saturated five-membered ring or a saturated six-membered ring (these rings may be with or without a substituent).

Oligomeric and polymeric carbazole derivative materials are a well-known class of materials. It has now been discovered how to synthesize highly conjugated poly (N-alkyl-2,7-carbazole) and a patent application entitled "Conjugated Polycarbazole Derivatives and Process for the synthesis thereof" on the method of synthesis was filed Oct. 31, 2001 under Ser. No. 10/003,774. Moreover, it has now been discovered that highly conjugated poly (N-alkyl-2,7-carbazole) can be used as active material in OLEDs and a patent application entitled "The Use of Conjugated Polycarbazole Derivatives in Organic Light Emitting Diodes" has been accorded (U.S. Pat. No. 6,630,254). The same authors of the former patent have discovered how to synthesized conjugated 2,7-carbazolenevinylene oligomeric and polymeric materials and a patent application entitled "2,7-carbazolenevinylene: A New Class of Organic Materials for Optical and Electrical Applications" on their method of synthesis was filed Aug. 15, 2003 under Ser. No. 60/495,113. The present invention provides, interalia, use of conjugated oligomeric and polymeric 2,7-carbazolenevinylene derivatives as the active material in OFETs, OLEDs, and OPCs.

2,7-carbazolenevinylene compounds can be used in OFETs as the active p-type semi-conductor or n-type semi-conductor where holes or electrons are the majority carriers respectively, depending of the end-caps and side groups used.

2,7-carbazolenevinylene compounds can be used in OLEDs as emitter, hole transport layers, electron transport layers or any combination of those roles depending of the end-caps and side groups used. They can be used either pure or blended or doped with other hole or electron transport materials. They can also be used in multilayer arrangements to promote confinement or as an alternative to doping.

2,7-carbazolenevinylene compounds can be used in OPCs as absorption layers, free carrier generation layers, hole transport layers, electron transport layers or any combination of those roles depending of the end-caps and side groups used. They can be used either pure or blended or doped with other materials. They can also be used in multilayer arrangements to promote charge transfer process or as an alternative to doping.

Conjugated oligomeric and polymeric 2,7-carbazolenevinylene derivatives can be synthesized by the following route:

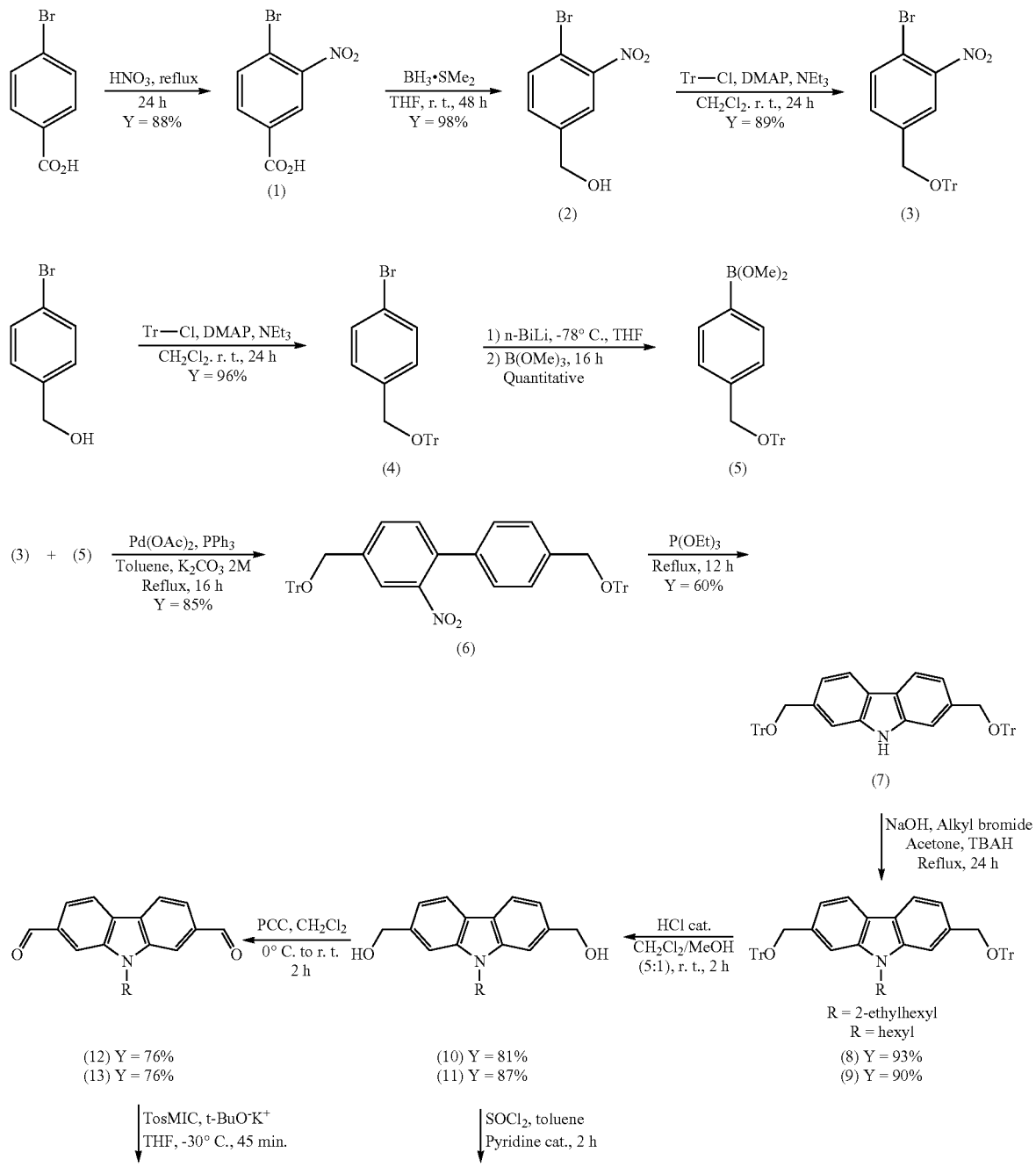

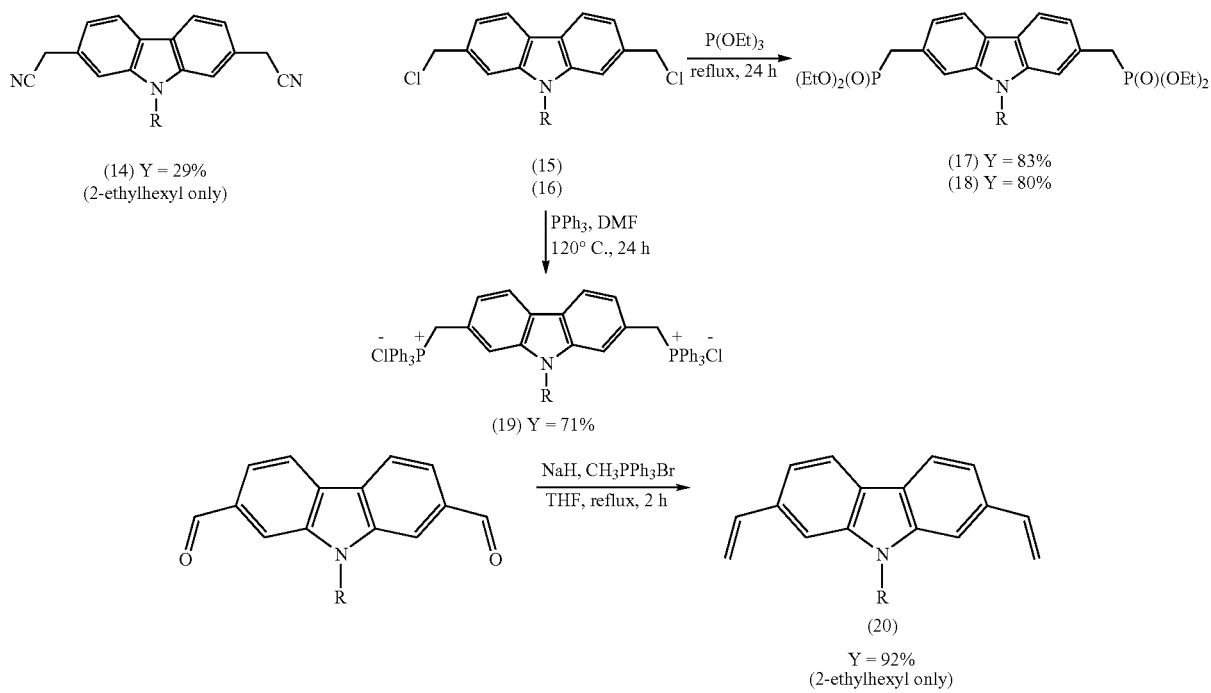
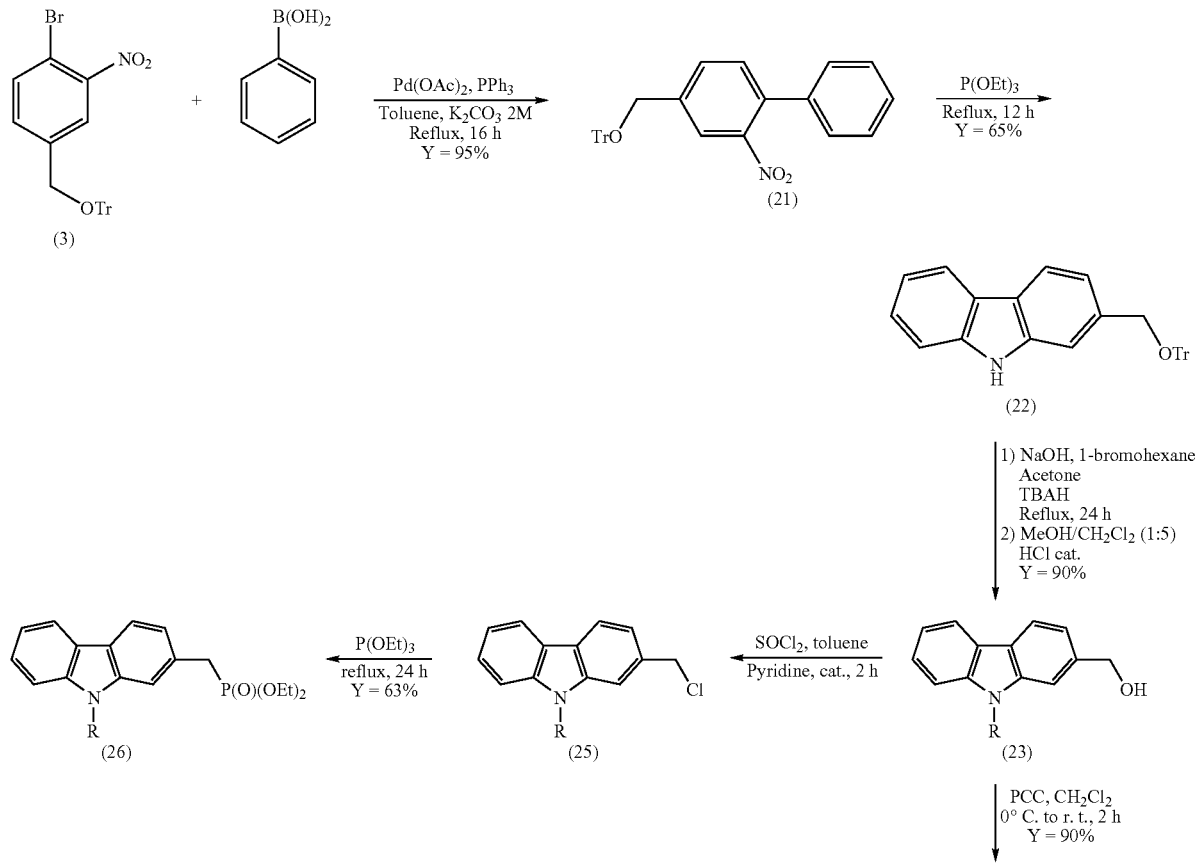

-continued
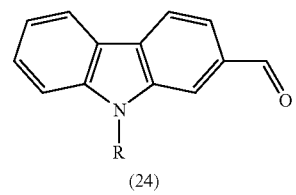
(24)
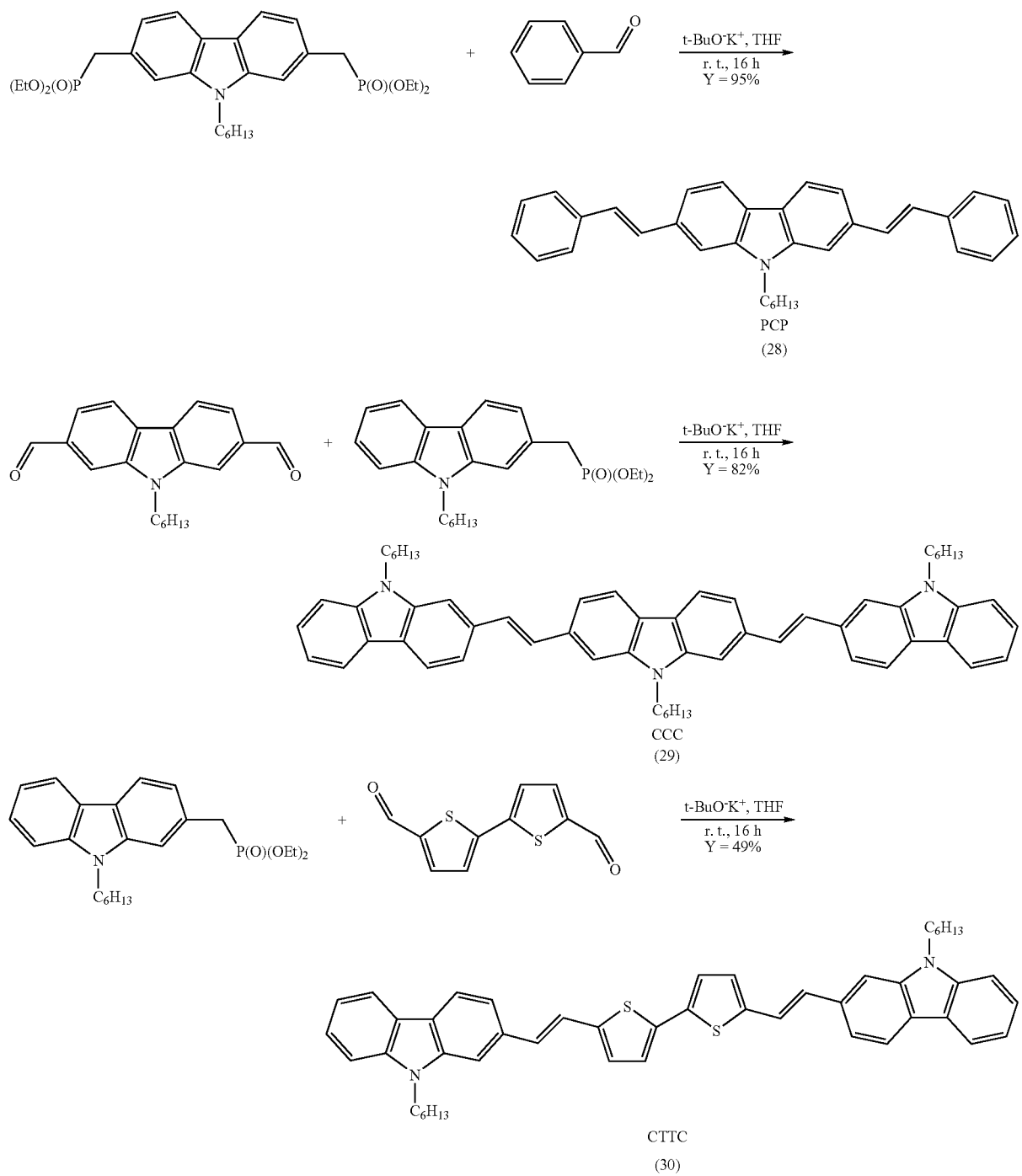

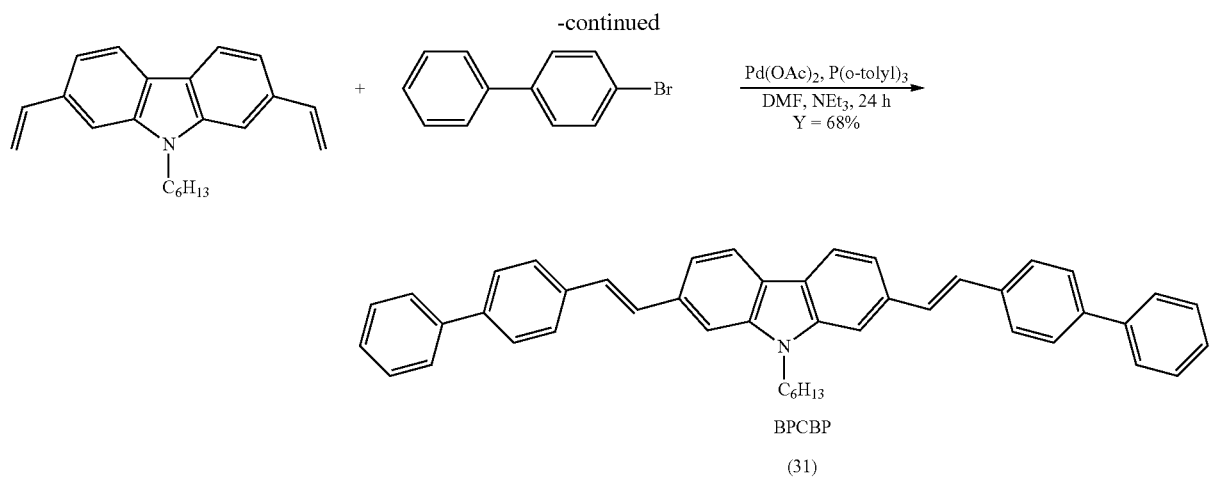
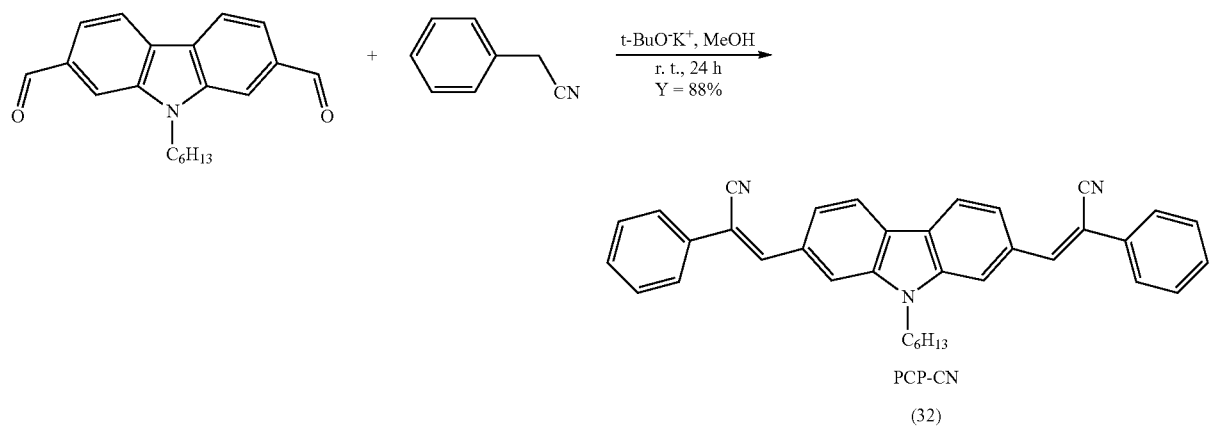
Scheme 4: Synthetic Route to 2,7-carbazolenevinylene polymers
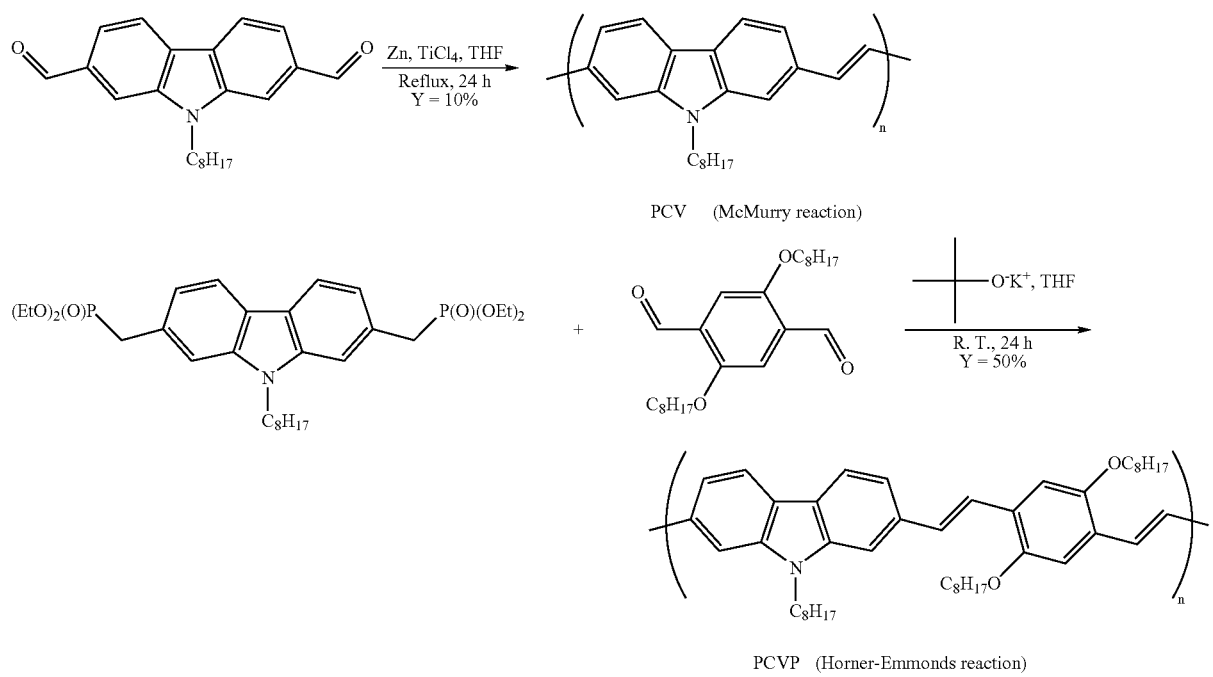

-continued

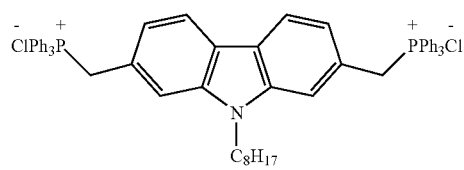
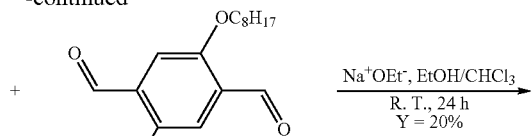
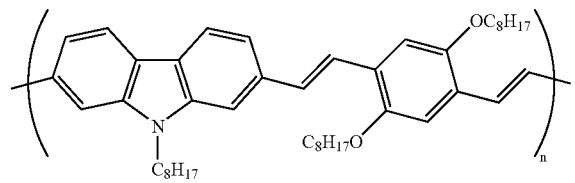

PCVP (Wittig reaction)

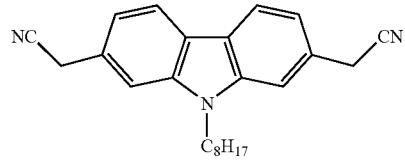
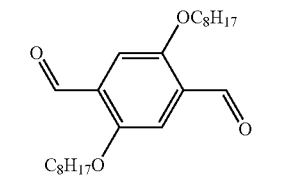
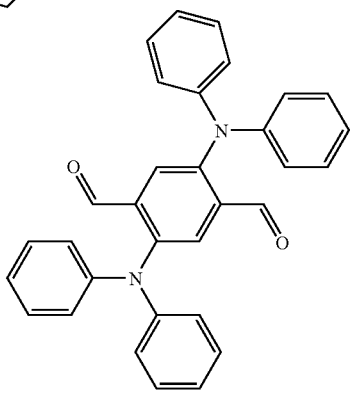

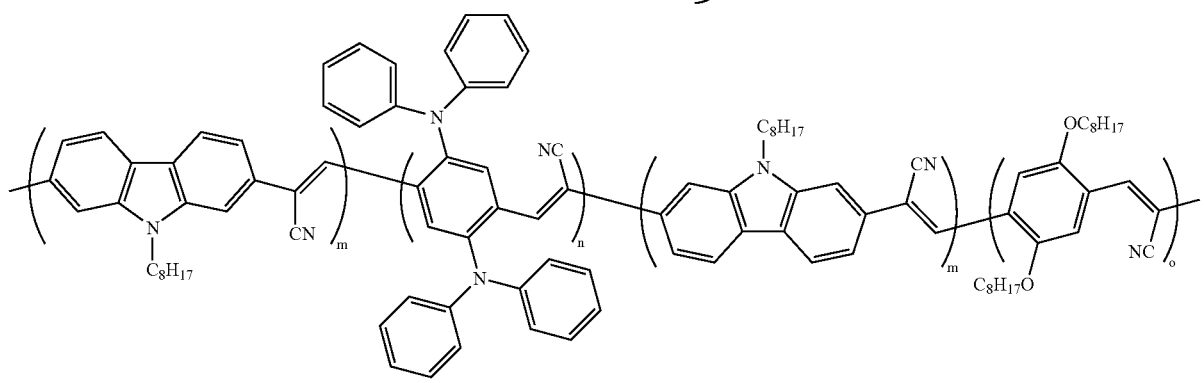

PCVDPAP (Knoevenagel Reaction)

BRIEF DESCRIPTION OF THE DRAWINGS

The invention will now be described in more details, by way of non-limiting example only, with reference to the accompanying drawings, in which:

FIGS. 7a and 7b show an embodiment of the present invention wherein an

Figure 7:
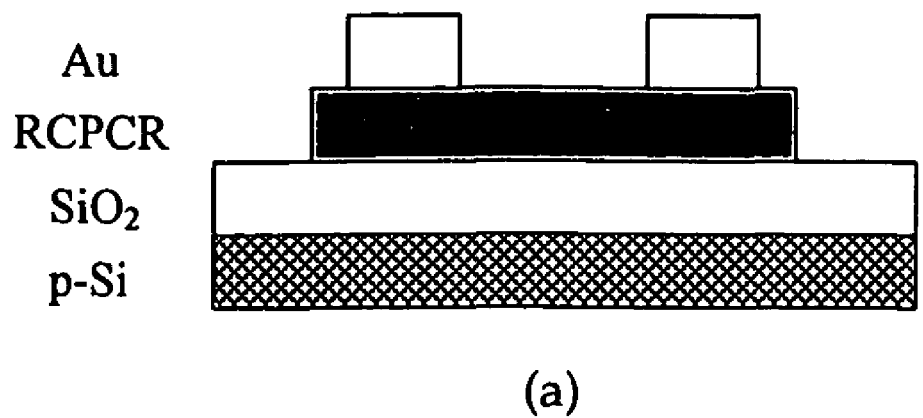
Figure 7:
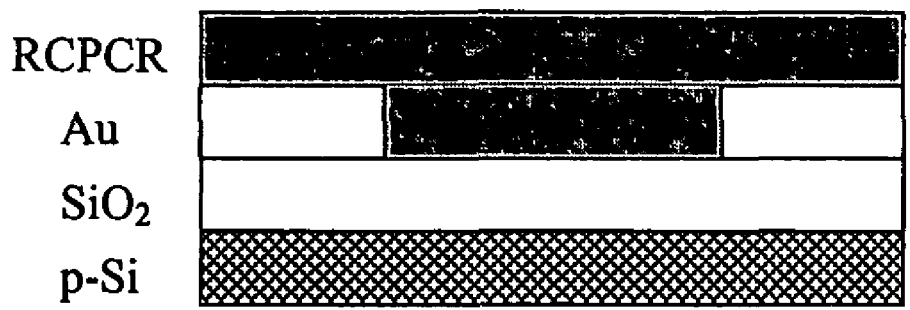
Figure 8:
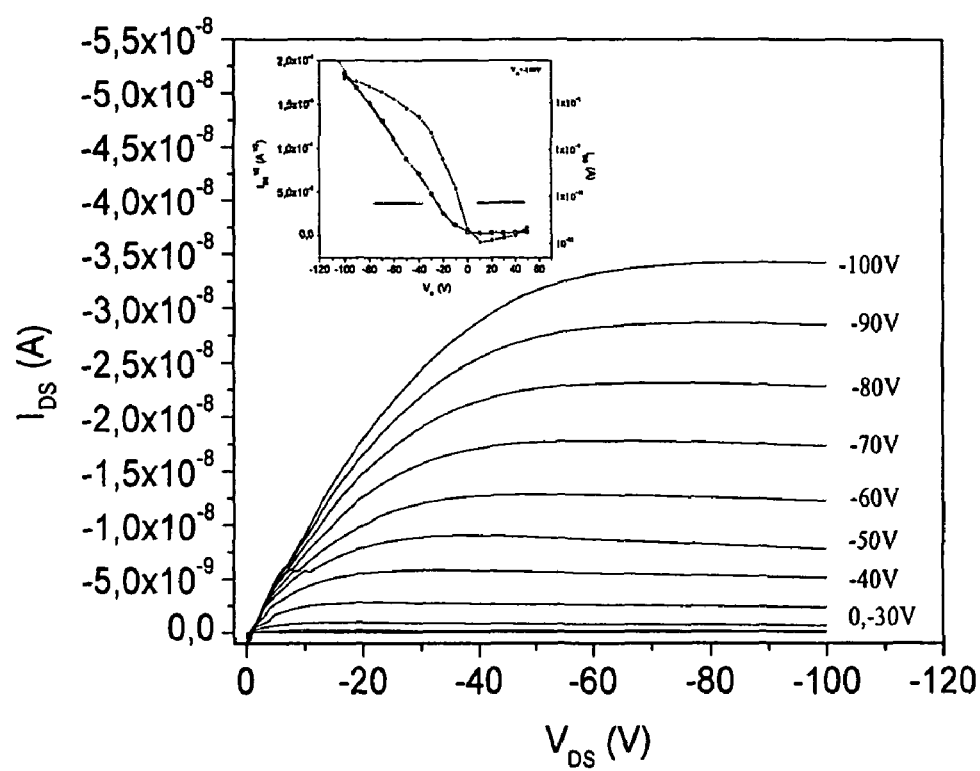

OFET is formed using RCPCR 1,4-bis(vinylene-(N-methyl-7-hexyl-2-carbazole))phenylene thin film as the active semi-conductor in the top contact and bottom contact geometry respectively;

FIG. 8 shows the current-voltage characteristics of the embodiment of the transistor shown in FIG. 7a (the top contact geometry).

FIGS. 9a, 9b and 9c show an embodiment of the present invention wherein an OFET is formed using CPC 1,4-bis(vinylene-(N-hexyl-2-carbazole))phenylene thin film as the active semi-conductor in the top contact geometry using selfassembling monolayer (SAM) chemically modified electrodes with hexamethyldisilazane (HMDS), octyltrichlorosilane (OTS) and octadecyltrichlorosilane (ODS) respectively.

Figure 9:
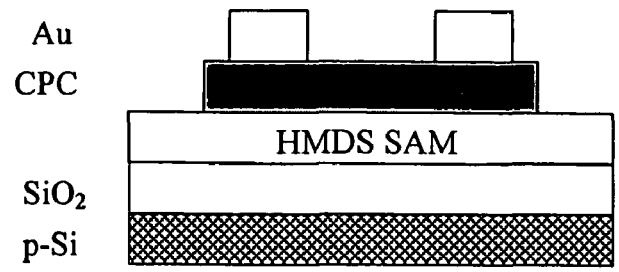
Figure 9:
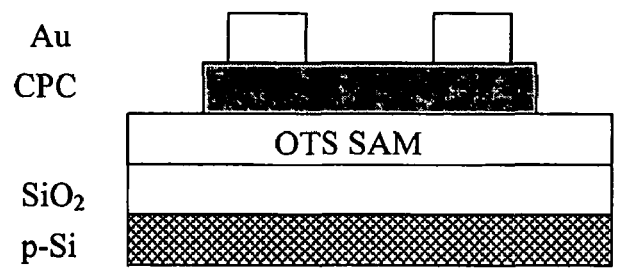
Figure 9:
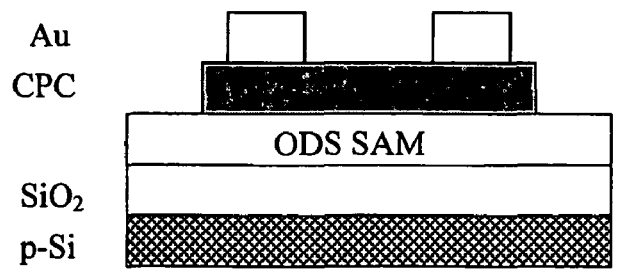
Figures 10, 11:
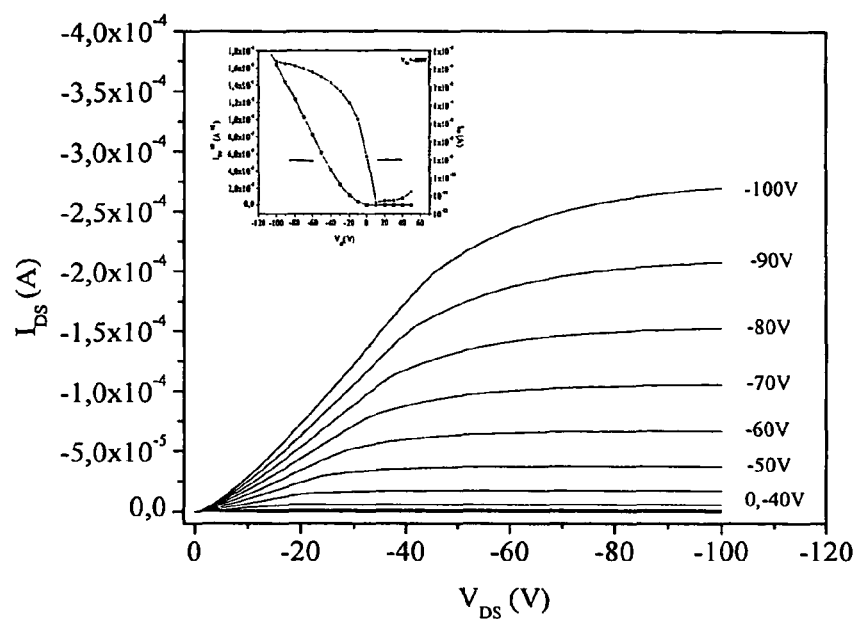

FIG. 10 shows the current-voltage characteristics of the embodiment of the transistor shown in FIG. 9a (the top contact geometry with HMDS chemically modified electrodes).

FIG. 11 shows the transistors performances (μ; mobility and $I_{on}/I_{off}$; current ratio) as a function of the temperature of the substrate during CPC thin film deposition depending of the type of electrode used.

Figure 12:
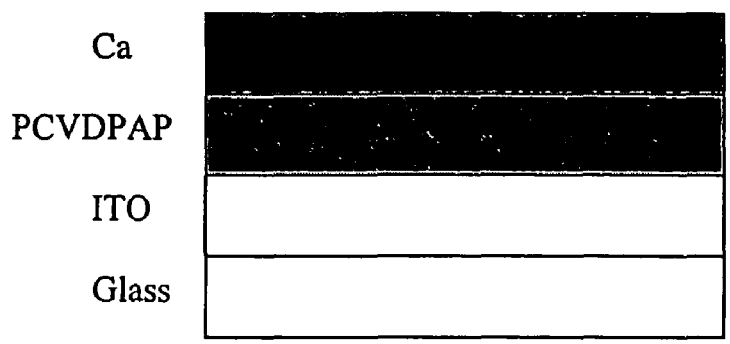
Figure 13:
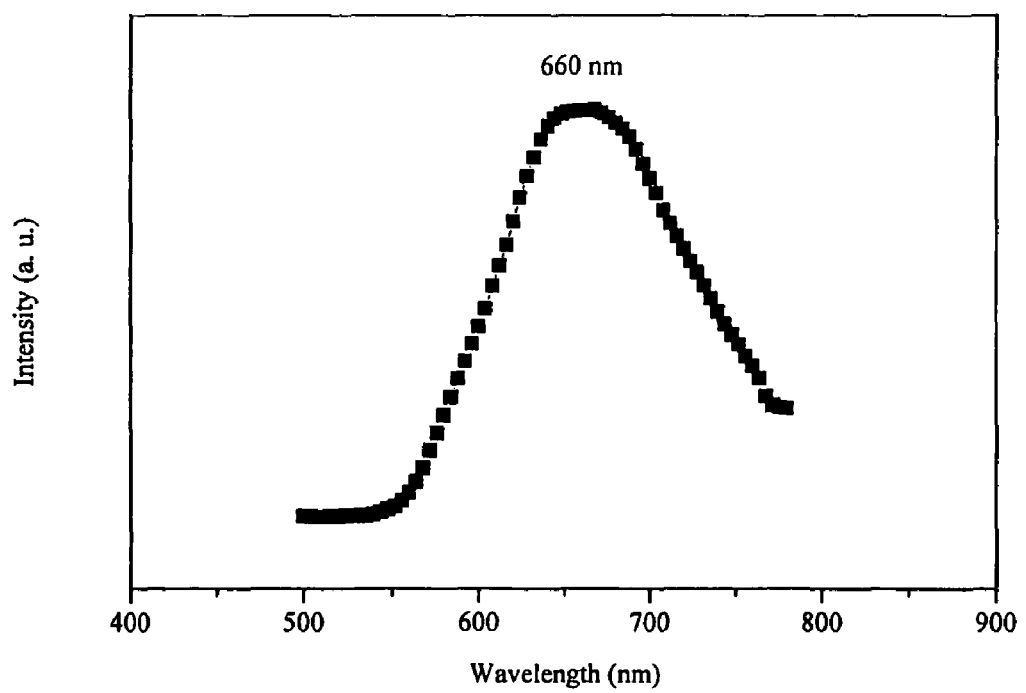
Figure 14:
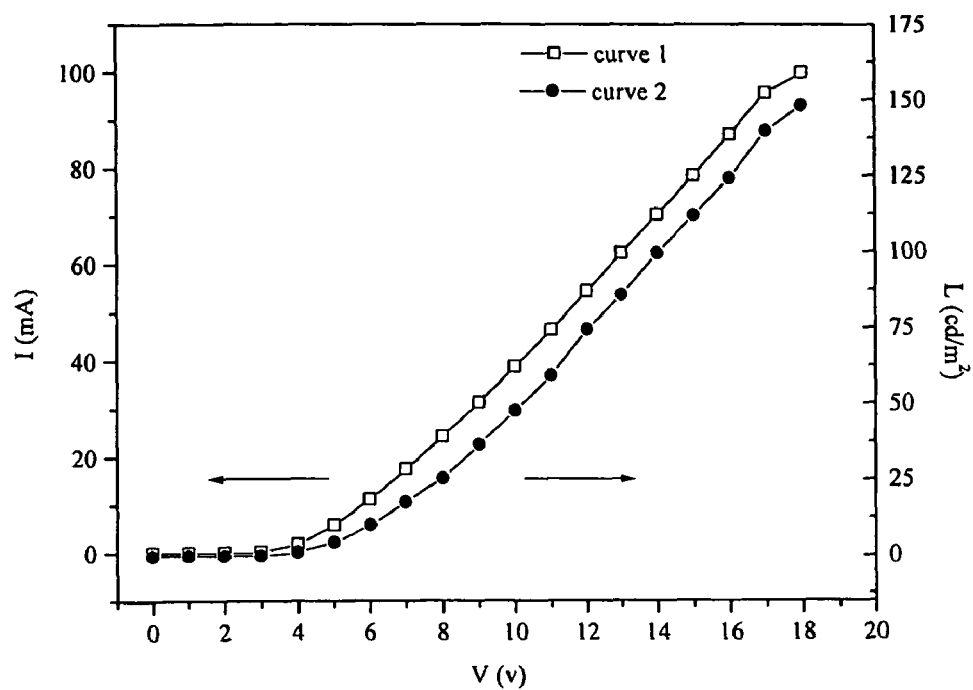
Figure 15:
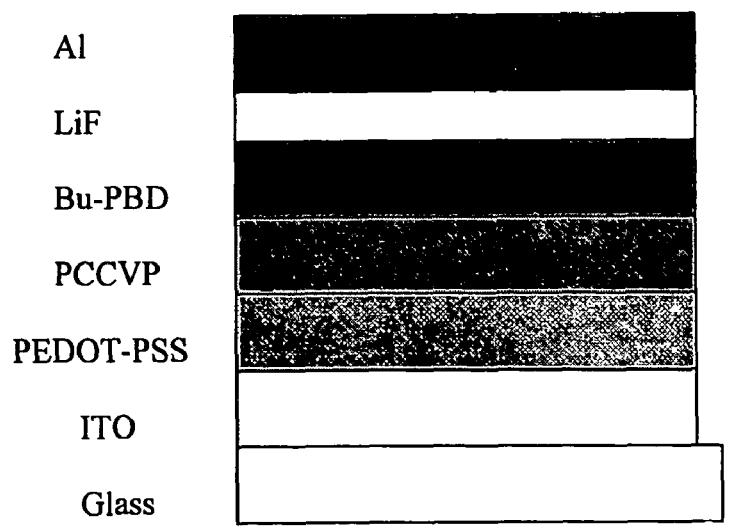
Figure 16:
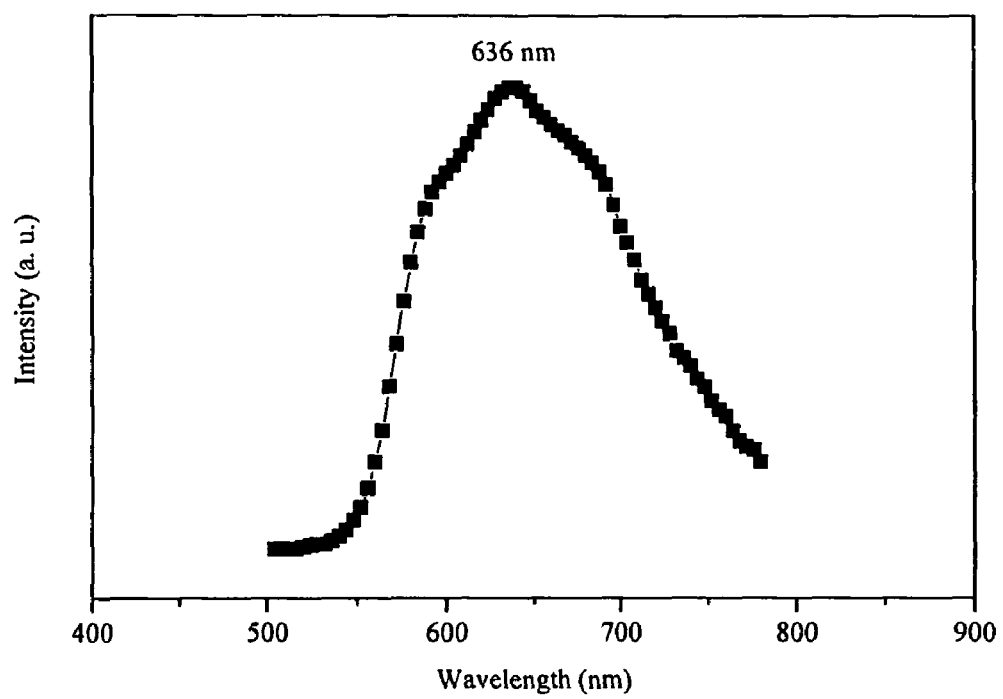
Figure 17:
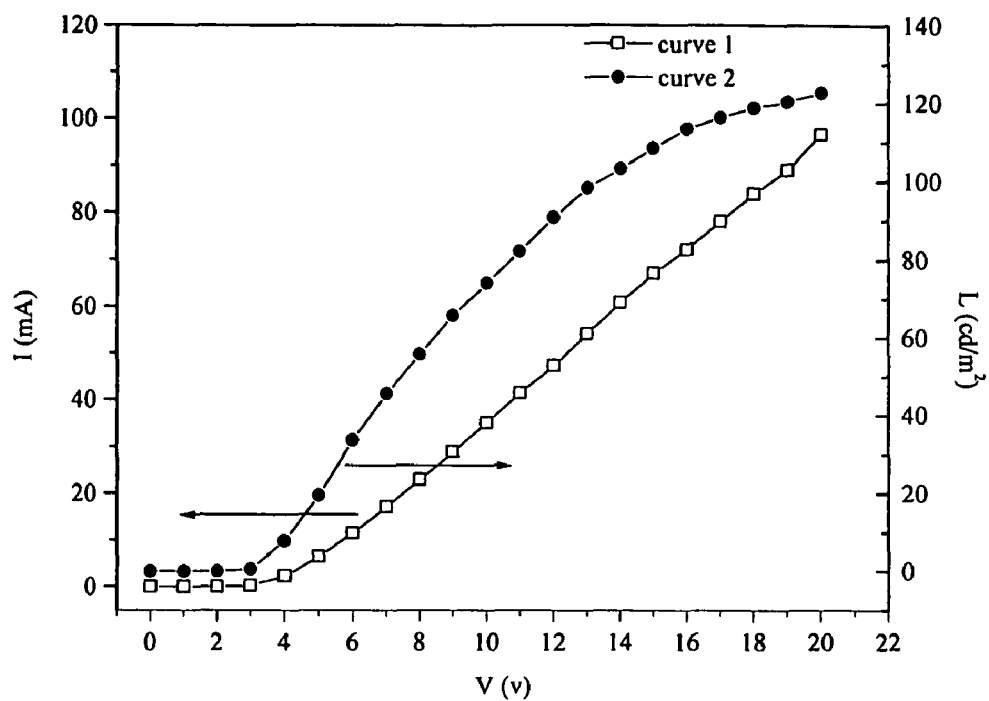
Figure 18:
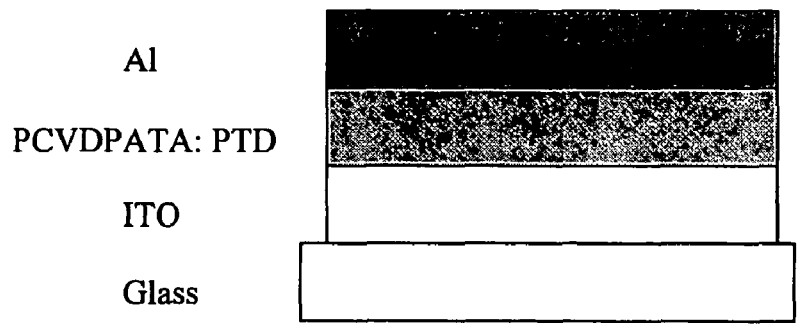
Figure 19:
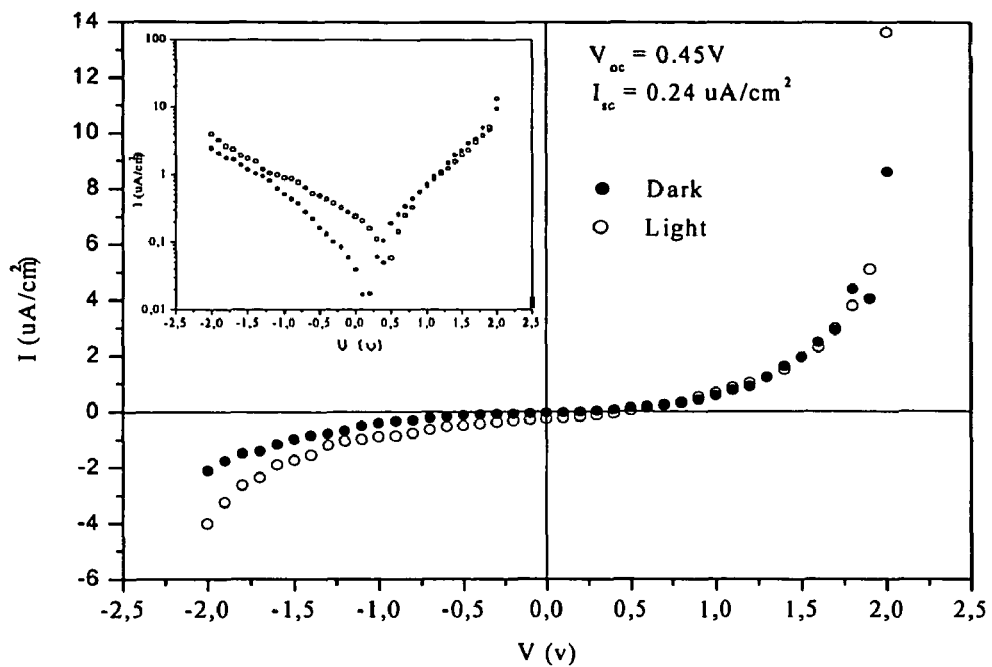

FIG. 12 shows an embodiment of the invention where an OLED is formed using a PCVDPAP [Poly (N-(2-ethylhexyl-2,7-carbazolenecyanovinylene-co-2,5-bis(diphenylamine)-1,4-phenylenecyanovinylene-co-2,5-dioctyloxy-1,4-phenylenecyanovinylene)] thin film as emitter. The diode consists of an Indium Tin Oxide transparent conductive anode on a glass substrate, PCVDPAP as the emitter and a Ca cathode;

FIG. 13 shows the electroluminescence spectrum of the diode illustrated in FIG. 12;

FIG. 14 shows the current-voltage (curve 1) and luminescence-voltage (curve 2) characteristics of the diode shown in FIG. 12;

FIG. 15 shows an embodiment of the invention where an OLED is formed using a PCCVP [Poly (N-(2-ethylhexyl)-2, 7-carbazolenecyanovinylene-alt-2,5-dioctyloxy-1,4-phenylenevinylene)] thin film as the emitter. The diode consists of an Indium Tin Oxide transparent conductive anode on a glass substrate, a thin PEDOT-PSS [Poly (ethylene dioxythiophene: polystryrene sulfonate)] layer to promote hole injection, PCCVP as the emitter, Bu-PBD (2-(4-biphenylyl)-5-(4-tert-butylphenyl)-1,3,4-oxadiazole) as the electron transport layer, a thin LiF layer to promote electron injection and an Al cathode;

FIG. 16 shows the electroluminescence spectrum of the embodiment of the diode illustrated in FIG. 15;

FIG. 17 shows the current-voltage (curve 1) and luminescence-voltage (curve 2) characteristics of the diode illustrated in FIG. 15;

FIG. 18 shows an embodiment of the invention where an OPC is formed using PCVDPATA [Poly (N-(2-ethylhexyl-2, 7-carbazolenevinylene-co-2,5-bis(diphenylamine)-1,4-phenylenevinylene-co-((4-(2-ethylhexyloxy)-phenyl)-bis-(4'-phenylene)amine)] mixed with PTD [N,N'-Bis(2,6-dimethylphenyl)-3,4,9,10-perylenetetracarboxylic diimide] as the absorbing and the transporting layer. The photovoltaic cell consists of an Indium Tin Oxide transparent conductive anode on a glass substrate, PCVDPATA: PTD (20:80) as the absorbing layer and an Al cathode;

FIG. 19 shows the current-voltage characteristics in dark and under illumination of the embodiment of the photovoltaic cell shown in FIG. 18.

Figure 20:
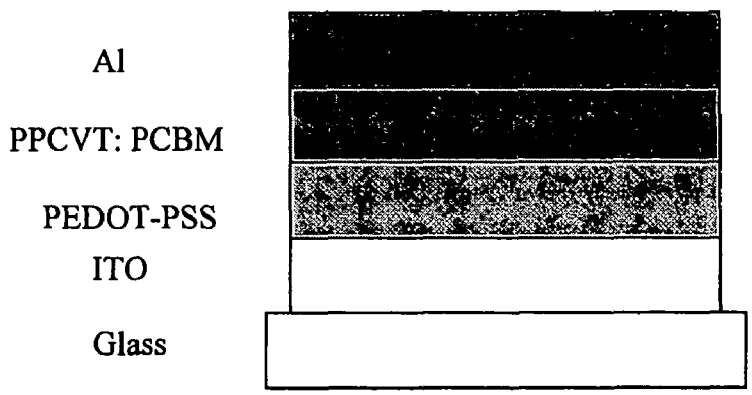

FIG. 20 shows an embodiment of the invention where an OPC is formed using

Figure 21:
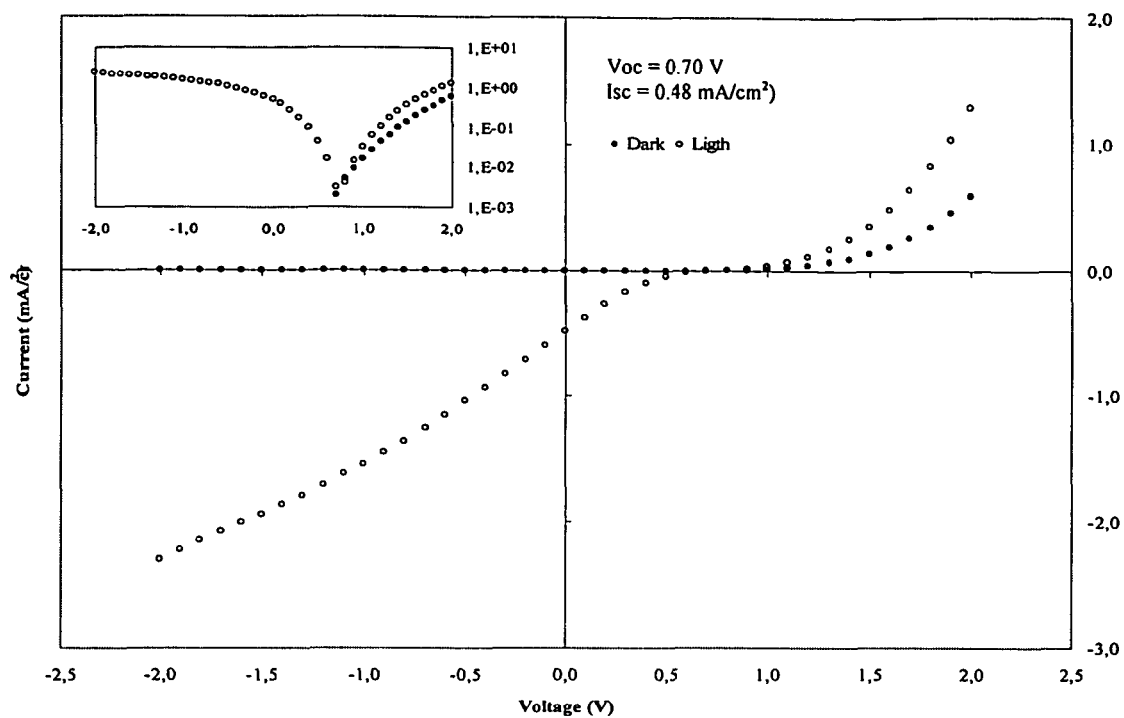

PPCVT [Poly (N-(4-hexyloxyphenyl)-2,7-carbazolenevinylene-alt-(3-hexyl-2,5-thiophenevinylene))] mixed with PCBM [6,6-phenyl-C61 butyric acid methyl ester] as the absorbing and the transporting layer. The photovoltaic cell consists of an Indium Tin Oxide transparent conductive anode on a glass substrate, PPCVT:PCBM (20:80) as the absorbing layer and an Al cathode; and FIG. 21 shows the current-voltage characteristics in dark and under illumination of the embodiment of the photovoltaic cell shown in FIG. 20.

DETAILED DESCRIPTION OF THE INVENTION

FIGS. 1 through 6 illustrate electronic and opto-electronic devices according to the prior art. The device shown in FIG. 1 consists of a n-type silicon wafer covered with a thermally grown $SiO_2$ film used as substrate, two gold electrodes (source and drain) on top of the substrate, a third electrode (gate) on the back side of the substrate, a thin (NiPc) nickel phthalocyanine layer, and a thin (ScPc) scandium phthalocyanine layer. When a sufficiently high negative voltage is applied to the gate, an inversion layer forms at the insulator/semi-conductor interface and positive charges are created. Varying the applied voltage at the gate, the negative current between the source and drain through the diphthalocyanine layer is modulated.

Figure 1:
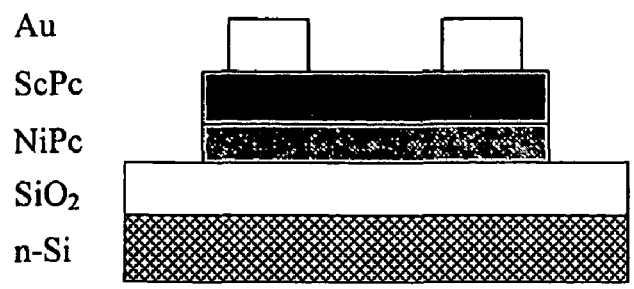
FIG. 1 shows a prior art small-molecule field-effect transistor.
Figure 2:
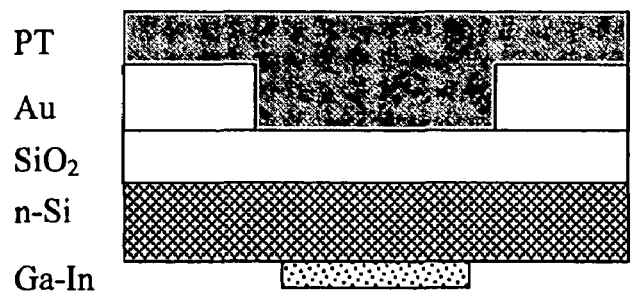
FIG. 2 shows a prior art polymer field-effect transistor.

The device shown in FIG. 2 consists of a n-type silicon wafer covered with a thermally grown $SiO_2$ film used as substrate, two gold electrodes (source and drain) on top of the substrate, a third gallium-induim electrode (gate) on the back side of the substrate, and a thin PT (polythiophene) layer. When a sufficiently high negative voltage is applied to the gate, an inversion layer forms at the insulator/semi-conductor interface and positive charges are created. By varying the applied voltage at the gate, the negative current between the source and drain through the PT layer is modulated.

Figure 3:
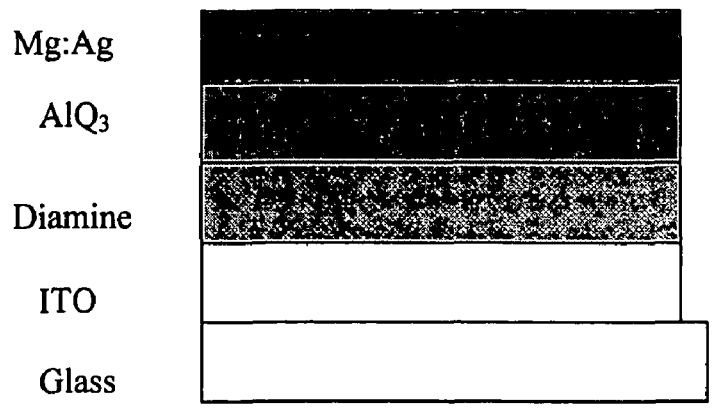
FIG. 3 shows a prior art small-molecule light-emitting diode.

The device shown in FIG. 3 consists of an Indium Tin Oxide transparent anode on a glass substrate, an aromatic diamine as the hole transport layer, an $AlQ_3$ (8-hydroxyquinoline aluminum) electron transport and emitter layer, and an Mg:Ag alloy cathode. When a sufficiently positive voltage is applied between the anode and the cathode, holes are injected from the anode, electrons are injected from the cathode and they recombine radiatively in the $AlQ_3$ emissive layer, producing light that is seen through the transparent anode and hole transport layer.

Figure 4:
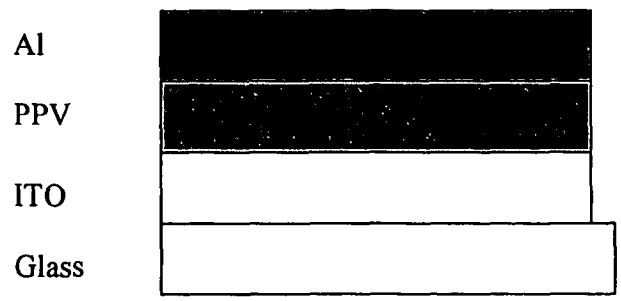
FIG. 4 shows a prior art polymer light-emitting diode.

The device shown in FIG. 4 consists of an Indium Tin Oxide transparent anode on a glass substrate, a thin PPV (poly(p-phenylenevinylene)) layer, and an Al cathode. When a sufficiently high positive voltage is applied between the anode and the cathode, holes are injected from the anode, electrons are injected from the cathode and they recombine radiatively in the PPV emissive layer, producing light that is seen through the transparent anode.

Figure 5:
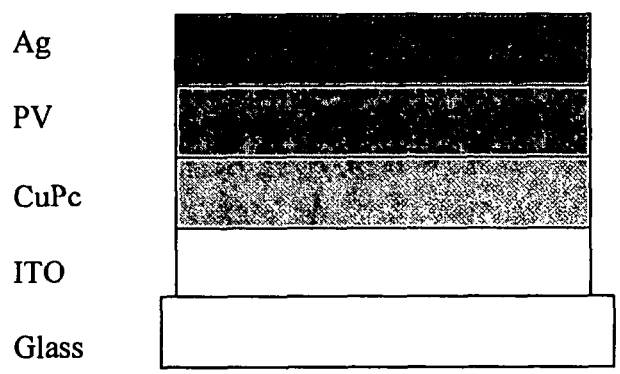
FIG. 5 shows a prior art small-molecule photovoltaic cell.

The device shown in FIG. 5 consists of an Indium Tin Oxide transparent anode on a glass substrate, a thin CuPc (copper phthalocyanine) layer, a thin PV (perylene tetracarboxylic) layer, and an Ag cathode. Under illumination through the transparent Indium Tin Oxide anode, charges are produced. When a sufficiently positive voltage is applied between the anode and the cathode, the photogenerated charges are transported and transferred to the electrodes.

Figure 6:
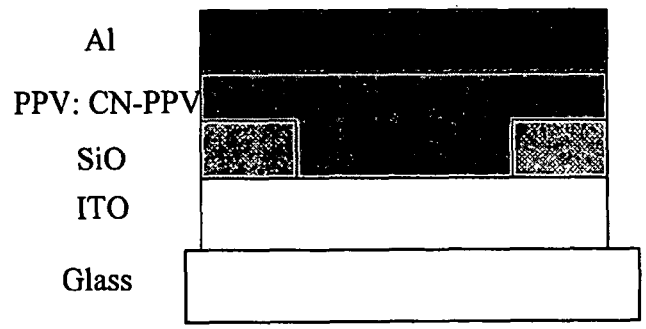
FIG. 6 shows a prior art polymer photovoltaic cell.

The device shown in FIG. 6 consists of an Indium Tin Oxide transparent anode on a glass substrate, a thin PPV (poly(p-phenylenevinylene)) layer, and an Al cathode. Under illumination through the transparent Indium Tin Oxide anode, charges are produced in PPV. When a sufficiently positive voltage is applied between the anode and the cathode, the photogenerated charges are transported and transferred to the electrodes.

Examples of organic-based devices prepared in accordance with the present invention will now be described.

FIRST EXAMPLE

In a first embodiment of the present invention as shown in FIG. 7, an OFET was fabricated in the top contact geometry consisting of; a p-type silicon wafer covered with a thermally grown $SiO_2$ film used as a substrate, a thin RCPCR semi-conductor layer, a source and drain gold electrode on top of the organic semi-conductor layer, and a gate electrode on the back side of the substrate. Prior to use, each substrate (15×15 mm²) is cleaned sequentially with acetone, ultrasonicated isopropanol at 80° C., and UV/ozone cleaner for 10 min. In order, the organic semi-conductor RCPCR and gold are deposited by thermal evaporation at a pressure of $1 \times 10^{-7}$ torr at a substrate temperature of 25° C. for RCPCR and 25° C. for gold. The gold source and drain electrodes are deposited on top of the organic semi-conductor through a shadow mask forming a top contact geometry with a channel length of 40 µm and a channel width of 1 µm. An electrical wired bonded on the backside of the p-doped silicon wafer forms the gate electrode.

The field effect transistor produces the current-voltage characteristics shown in FIG. 8. It is shown that RCPCR forms a typical p-channel transistor operating in two different modes, which are the linear regime where the current follows Ohm's law at low source-drain voltage and the saturation regime as the source-drain voltage increase. In the conditions described above, RCPCR shows a mobility of $1.0 \times 10^{-4}$ cm²/V and $I_{on}/I_{off}$ ratio of $10^4$.

SECOND EXAMPLE

In a second embodiment of the present invention as shown in FIG. 9, an OFET was fabricated in the top contact geometry consisting of: a p-type silicon wafer covered with a thermally grown $SiO_2$ film used as a substrate, a thin CPC semi-conductor layer, a source and drain gold electrode on top of the organic semi-conductor layer, and a gate electrode on the back side of the substrate. Prior to use, each substrate (15×15 mm²) is cleaned sequentially with acetone, ultrasonicated isopropanol at 80° C., and UV/ozone cleaner for 10 min. Then, the substrate was treated sequentially in a $NH_4OH/H_2O_2/H_2O$ (2:2:100) solution for 15 min, $H_2O$ for 1 min, $HCl/H_2O_2/H_2O$ (2:2:100) solution for 15 min, $H_2O$ for 1 min, dried with $N_2$ and put in the UV/ozone cleaner for 1 h. Then, the surface of the substrate was treated with hexamethyldisilazane (HMDS) on a vapor prime system at 150° C. and 30 mmHg for 2 h prior to evaporation. In order, the organic semi-conductor CPC and gold are deposited by thermal evaporation at a pressure of $1 \times 10^{-7}$ torr at a substrate temperature of 75° C. and 25° C. for gold. The gold source and drain electrodes are deposited on top of the organic semi-conductor through a shadow mask forming a top contact geometry with a channel length of 58 µm and a channel width of 1 µm. An electrical wired bonded on the backside of the p-doped silicon wafer forms the gate electrode.

The field effect transistor produces the current-voltage characteristics shown in FIG. 10. It is shown that CPC forms a typical p-channel transistor operating in two different modes, which are the linear regime where the current follows Ohm's law at low source-drain voltage and the saturation regime as the source-drain voltage increase. In the conditions described above, CPC shows a high mobility of $2.5 \times 10^{-1}$ cm²/V and a high $I_{on}/I_{off}$ ratio of $10^6$.

THIRD EXAMPLE

In a third embodiment of the invention as shown in FIG. 12, an OLED was fabricated consisting of; an Indium Tin Oxide transparent conductive anode on a glass substrate, a thin PCVDPAP layer as emitter, and a Ca cathode. The Indium Tin Oxide coated glass (5×5 cm²) with a sheet resistance of 15 ohm/sq is patterned using photolithography techniques to produce ten segments each with an active area of 5×6 mm². Prior to use, the substrates are cleaned sequentially with detergent, deionized water, acetone, ultrasonicated isopropanol at 60° C., and UV/ozone cleaner for 10 min. The polymeric PCVDPAP material is solubilized in chloroform, filtered through a 0,2 µm PTFE filter, spin-coated at 2000 rpm for 60 s onto the Indium Tin Oxide substrate, and dried at 40° C. for 10 min. The Ca layer is thermally evaporated at a pressure of $1 \times 10^{-7}$ ton and at room temperature.

The OLED produced the electroluminescence spectrum shown in FIG. 13. The resulting diode emitted orange-red light with peak emission around 660 nm. No emission of an excimer is observed (no emission peak at higher wavelengths). The current-voltage (curve 1) and luminescence-voltage (curve 2) characteristics of the diode are shown in FIG. 14. In the device configuration described above, the maximum luminescence value that has been obtained is 150 cd/m² at 18 V with a low turn-on device voltage of 3 V.

FOURTH EXAMPLE

In a fourth embodiment of the invention as shown in FIG. 15, an OLED was fabricated consisting of an Indium Tin Oxide transparent conductive anode on a glass substrate, a thin PEDOT-PSS layer to promote hole injection, a thin PCCVP layer as emitter, Bu-PBD as the electron transport layer, a thin LiF layer to promote electron injection, and an Al cathode. The Indium Tin Oxide coated glass (5×5 cm²) with a sheet resistance of 15 ohm/sq is patterned using photolithography techniques to produce ten segments each with an active area of 5×6 mm². Prior to use, the substrates are cleaned sequentially with detergent, deionized water, acetone, ultrasonicated isopropanol, at 60° C., and UV/ozone cleaner for 10 min. The thin PEDOT-PSS (Baytron P CH 8000, Bayer/Germany) layer is first applied by spin-coating at 5000 rpm for 60 s from its water solution (2.8 wt %) onto the Indium Tin Oxide substrate, and dried at 120° C. for 1 h. The polymeric PCCVP material is solubilized in chloroform, filtered through a 0,2 µm PTFE filter, spin-coated at 2000 rpm for 60 s, and dried at 40° C. for 10 min. Bu-PBD, LiF and Al layers are thermally evaporated at a pressure of $1 \times 10^{-7}$ torr and at room temperature.

The diode produced the electroluminescence spectrum shown in FIG. 16. The resulting diode emitted orange-red light with peak emission around 636 nm.

The electroluminescence is thus originating from PCCVP itself. No emission of an excimer is observed (no emission peak at higher wavelength). The current-voltage (curve 1) and luminescence-voltage (curve 2) characteristics of the diode are shown in FIG. 17. In the device configuration described above, the maximum luminescence value that has been obtained is 122 cd/m² at 20 V with a low turn-on device voltage of 3 V.

FIFTH EXAMPLE

In a fifth embodiment of the invention shown in FIG. 18, an OPC was fabricated consisting of an Indium Tin Oxide transparent conductive anode on a glass substrate, a blend of PCVDPATA and PTD (20:80) as the absorbing and transporting layer, and an Al cathode. The Indium Tin Oxide coated glass (25×25 mm²) with a sheet resistance of 20 ohms/sq is patterned using photolithography techniques to produce one segment with active area of 10 mm². Prior to use, the substrates were cleaned sequentially with detergent, deionized water, acetone and ultrasonicated isopropanol. The PCVDPATA:PTD (20:80) blend is solubilized in chloroform, filtered through a 0,2 µm PTFE filter and spin-coated at 2000 rpm for 60 s. An Al layer was thermally evaporated at a pressure of $1 \times 10^{-6}$ torr at room temperature.

The photovoltaic cell produced the current-voltage characteristics in dark and under illumination shown in FIG. 19.

SIXTH EXAMPLE

In a sixth embodiment of the invention shown in FIG. 20, an OPC was fabricated consisting of an Indium Tin Oxide transparent conductive anode on a glass substrate, a thin PEDOT-PSS layer to promote hole injection, a blend of PPCVT and PCBM (20:80) as the absorbing and transporting layer, and an Al cathode. The Indium Tin Oxide coated glass (25×25 mm$^2$) with a sheet resistance of 20 ohms/sq is patterned using photolithography techniques to produce one segment with active area of 10 mm$^2$. Prior to use, the substrates were cleaned sequentially with detergent, deionized water, acetone and ultrasonicated isopropanol. The PPCVT:PCBM (20:80) blend is solubilized in chloroform, filtered through a 0,2 μm PTFE filter and spin-coated at 2000 rpm for 60 s. An Al layer was thermally evaporated at a pressure of $1 \times 10^{-6}$ ton at room temperature.

The photovoltaic cell produced the current-voltage characteristics in dark and under illumination shown in FIG. 21.

It will be appreciated that, in light of the disclosure herein, one skilled in the art could employ the method disclosed herein to produce OLEDs and related devices from carbazolene derivatives in addition to the 2,7 derivatives described in the examples herein.

There follows a summary of embodiments contemplated by the present invention. It is to be understood, however, that these are intended as being representations and in no way limiting the full scope of the invention.

In one embodiment of the invention there is provided an Organic Field Effect Transistor (OFET), an Organic Light Emitting Diode (OLED), and an Organic Photovoltaic Cell (OPC) comprising active material including a conjugated oligomeric or polymeric 2,7-carbazolenevinylene derivative described by the formula (I):

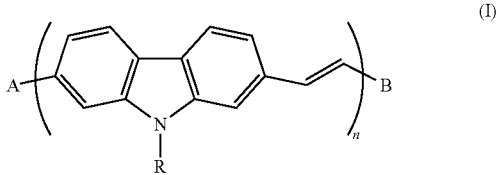
(I)

wherein n is an integer≧3, R represents a substituent that is a hydrogen, or linear or branched alkyl group containing 1 to 20 carbon atoms, linear or branched alkoxy group containing 1 to 20 carbon atoms, poly (ethyleneoxy), cyano, aryl group, amide group or benzoyl group, and A, B are any type of end-cap groups selected from the group consisting of hydrogen, linear or branched alkyl group containing 1 to 20 carbon atoms, linear or branched alkoxy group containing 1 to 20 carbon atoms, cyano group, halogen group, monovalent aromatic group, and monovalent aromatic complex ring group having one nitrogen atom as a hetero-atom.

In another embodiment of the invention there is provided an Organic Field Effect Transistor (OFET), an Organic Light Emitting Diode (OLED), and an Organic Photovoltaic Cell (OPC) comprising active material including a conjugated 2,7-carbazolenevinylene derivative where 2,7-carbazolenevinylene monomers can also be alternated with other monomers to form oligomeric or polymeric materials according to the general formula (II):

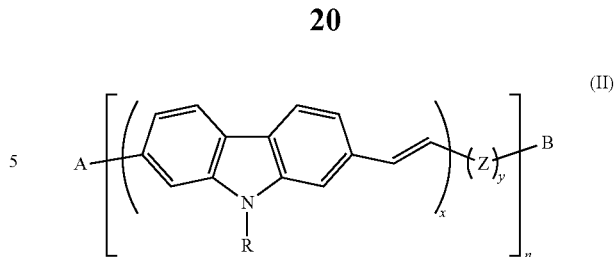
(II)

wherein n is an integer≧3, R represents a substituent that is a hydrogen, or linear or branched alkyl group containing 1 to 20 carbon atoms, linear or branched alkoxy group containing 1 to 20 carbon atoms, poly (ethyleneoxy), cyano, aryl, amide or benzoyl, X is an integer, between 1 to 1000, y is an integer between 0 to 1000, Z is any type of comonomer selected from the group consisting of ethylene, acetylene, $C_6$-$C_{22}$ mononuclear/polynuclear aromatic, $C_2$-$C_{10}$ mononuclear/polynuclear heterocyclic groups and tertiary arylamines, and A, B are any type of end-cap groups selected from the group consisting of hydrogen, linear or branched alkyl group containing 1 to 20 carbon atoms, linear or branched alkoxy group containing 1 to 20 carbon atoms, cyano group, halogen group, monovalent aromatic group, and monovalent aromatic complex ring group having one nitrogen atom as a hetero-atom.

In a further embodiment of the invention there is provided an OFET, wherein said 2,7-carbazolenevinylene derivative is 1,4-bis(vinylene-(N-methyl-7-hexyl-2-carbazole))phenylene (RCPCR).

In a further embodiment of the invention there is provided an OFET, wherein said 2,7-carbazolenevinylene derivative is 1,4-bis(vinylene-(N-hexyl-2-carbazole))phenylene (CPC).

In a still further embodiment of the invention there is provided an OLED, wherein said 2,7-carbazolenevinylene derivative is [Poly (N-(2-ethylhexyl-2,7-carbazolenecyanovinylene-co-2,5-bis(diphenylamine)-1,4-phenylenecyanovinylene-co-2,5-dioctyloxy-1,4-phenylenecyanovinylene)] (PCVDPAP).

In a still further embodiment of the invention there is provided an OLED, wherein said 2,7-carbazolenevinylene derivative is [Poly (N-(2-ethylhexyl)-2,7-carbazolenecyanovinylene-alt-2,5-dioctyloxy-1,4-phenylenevinylene)] (PCCVP).

In a still further embodiment of the invention there is provided an OLED, wherein said 2,7-carbazolenevinylene derivative is mixed with a second active material.

In a still further embodiment of the invention there is provided an OLED comprising a hole transport layer, an electron transport layer, and wherein at least one of said hole transport layer and said electron transport layer comprises either alone or in combination as active material a conjugated 2,7-carbazolenevinylene derivative.

In a still further embodiment of the invention there is provided an OLED, further comprising a carrier promotion layer adjacent at least one of said electron transport layer and said hole transport layer.

In a still further embodiment of the invention there is provided an OLED, wherein said electron promotion is LiF.

In a still further embodiment of the invention there is provided an OLED, wherein said hole promotion is [Poly (ethylene dioxythiophene: polystryrene sulfonate)] (PEDOT-PSS).

In yet another embodiment of the invention there is provided an OLED, wherein said hole promotion is [Poly (ethylene dioxythiophene: polystryrene sulfonate)] (PEDOT-PSS), said hole transport is [Poly (N-(2-ethylhexyl)-2,7-carbazolenecyanovinylene-alt-2,5-dioctyloxy-1,4- phenylenevinylene)] (PCCVP), said electron transport layer is Bu-PBD (2-(4-biphenylyl)-5-(4-tert-butylphenyl)-1,3,4-oxadiazole) and said electron promotion is LiF.

In another embodiment of the invention there is provided an OPC, wherein said 2,7-carbazolenevinylene derivative is [Poly (N-(2-ethylhexyl-2,7-carbazolenevinylene-co-2,5-bis(diphenylamine)-1,4-phenylenevinylene-co-((4-(2-ethylhexyloxy)-phenyl)-bis-(4-phenylene)amine)] (PCVDPATA).

In another embodiment of the invention there is provided an OPC, wherein said 2,7-carbazolenevinylene derivative is [Poly (N-(4-hexyloxyphenyl)-2,7-carbazolenevinylene-alt-(3-hexyl-2,5-thiophenevinylene))] (PPCVT).

In another embodiment of the invention there is provided an OPC, wherein said 2,7-carbazolenevinylene derivative is mixed with a second active material.

In another embodiment of the invention there is provided an OPC, wherein said second active material is [N,N'-Bis(2,6-dimethylphenyl)-3,4,9,10-perylenetetracarboxylic diimide] (PTD).

In another embodiment of the invention there is provided an OPC, wherein said second active material is [6,6-phenyl-C61 butyric acid methyl ester] (PCBM).

In another embodiment of the invention there is provide an OPC comprising a hole transport layer, an electron transport layer, and wherein at least one of said hole transport layer and said electron transport layer comprises either alone or in combination as active material a conjugated 2,7-carbazolenevinylene derivative.

The invention claimed is:

1. An organic based device which is an organic Field Effect Transistor (OFET) or an Organic Photovoltaic Cell (OPC), the device comprising as a first active material a conjugated oligomeric 2,7-carbazolenevinylene derivative described by the formula I:

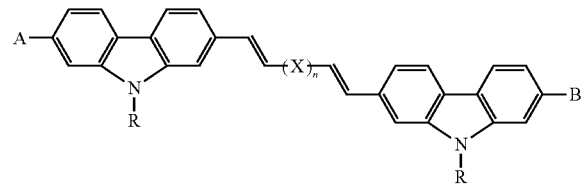

(I)

wherein X is a comonomer selected from the group consisting of ethylene, acetylene, a $C_6$-$C_{22}$ mononuclear/polynuclear aromatic group, a $C_2$-$C_{10}$ mononuclear/polynuclear heterocyclic group, and a tertiary arylamine, wherein A is selected from hydrogen, a linear or branched alkyl group containing 1 to 20 carbon atoms, a linear or branched alkoxy group containing 1 to 20 carbon atoms, a cyano group, a halogen group, a monovalent aromatic group, and a monovalent aromatic complex ring group having one nitrogen atom as a hetero-atom, wherein B is selected from hydrogen, a linear or branched alkyl group containing 1 to 20 carbon atoms, a linear or branched alkoxy group containing 1 to 20 carbon atoms, a cyano group, a halogen group, a monovalent aromatic group, and a monovalent aromatic complex ring group having one nitrogen atom as a hetero-atom, wherein R is selected from hydrogen, a linear or branched alkyl group containing 1 to 20 carbon atoms, a linear or branched alkoxy group containing 1 to 20 carbon atoms, a poly (ethyleneoxy) group, a cyano group, an aryl group, an amide group, and a benzoyl group, and where n is an integer equal to 1 or 2.

2. The organic based device of claim 1 being an OFET, and wherein the first active material is 1,4-bis(vinylene-(N-methyl-7-hexyl-2-carbazole))phenylene (RCPCR).

3. The organic based device of claim 1 being an OFET, and wherein the first active material is 1,4-bis(vinylene-(N-hexyl-2-carbazole))phenylene (CPC).

4. The organic based device of claim 1 being an OPC and further comprising a second active material, wherein said first active material is mixed with the second active material.

5. The organic based device of claim 4, wherein said second active material is [N,N'-Bis(2,6-dimethylphenyl)-3,4,9,10-perylenetetracarboxylic diimide] (PTD).

6. The organic based device of claim 4, wherein said second active material is [6,6-phenyl-C61 butyric acid methyl ester] (PCBM).

7. The organic based device of claim 1 being an OPC comprising a hole transport layer and an electron transport layer, and wherein at least one of said hole transport layer and said electron transport layer comprises either alone or in combination as active material the compound of Formula I.

8. The organic based device of claim 1 being an OFET.

9. The organic based device of claim 1 being an OPC.

10. An organic based device which is, an organic Field Effect Transistor (OFET) or an Organic Photovoltaic Cell (OPC), the device comprising as a first active material a polymer of monomers defined by Formula II:

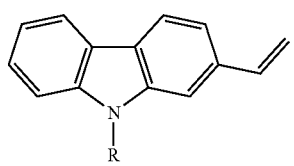

(II)

and optionally of a second comonomer which is one of ethylene, acetylene, a $C_6$-$C_{22}$ mononuclear/polynuclear aromatic group, a $C_2$-$C_{10}$ mononuclear/polynuclear heterocyclic group, and a tertiary arylamine,
wherein R is selected from hydrogen, a linear or branched alkyl group containing 1 to 20 carbon atoms, a linear or branched alkoxy group containing 1 to 20 carbon atoms, a poly (ethyleneoxy) group, a cyano group, an aryl group, an amide group, and a benzoyl group, the polymer having a first end-cap group selected from hydrogen, a linear or branched alkyl group containing 1 to 20 carbon atoms, a linear or branched alkoxy group containing 1 to 20 carbon atoms, a cyano group, a halogen group, a monovalent aromatic group, and a monovalent aromatic complex ring group having one nitrogen atom as a hetero-atom,
and the polymer having a second end-cap group selected from hydrogen, a linear or branched alkyl group containing 1 to 20 carbon atoms, a linear or branched alkoxy group containing 1 to 20 carbon atoms, a cyano group, a halogen group, a monovalent aromatic group, and a monovalent aromatic complex ring group having one nitrogen atom as a hetero-atom.

11. The organic based device of claim 10 being an OPC, and wherein the first active material is [Poly (N-(2-ethylhexyl-2,7-carbazolenevinylene-co-2,5-bis(diphenylamine)-1,4-phenylenevinylene-co-((4-(2-ethylhexyloxy)-phenyl)-bis-(4'-phenylene)amine)] (PCVDPATA).

12. The organic based device of claim 10 being an OPC, and wherein the first active material is [Poly (N-(4-hexyloxyphenyl)-2,7-carbazolenevinylene-alt-(3-hexyl-2,5-thiophenevinylene))] (PPCVT).

13. The organic based device of claim 10 being an OPC and further comprising a second active material, wherein said first active material is mixed with the second active material.

14. The organic based device of claim 13, wherein said second active material is [N,N'-Bis(2,6-dimethylphenyl)-3,4,9,10-perylenetetracarboxylic diimide] (PTD).

15. The organic based device of claim 13, wherein said second active material is [6,6-phenyl-C61 butyric acid methyl ester] (PCBM).

16. The organic based device of claim 10 being an OPC comprising a hole transport layer and an electron transport layer, and wherein at least one of said hole transport layer and said electron transport layer comprises either alone or in combination as active material the compound of Formula II.

17. The organic based device of claim 10 being an OFET and there being no second comonomer.

18. The organic based device of claim 10 being an OPC and there being no second comonomer.

\* \* \* \* \*